(12) United States Patent
Hsuan et al.

(10) Patent No.: US 8,446,565 B2
(45) Date of Patent: May 21, 2013

(54) METHODS OF OPTICAL PROXIMITY CORRECTION IN MANUFACTURING SEMICONDUCTOR DEVICES

(75) Inventors: Chung Te Hsuan, Tainan (TW); Tzong-Hsien Wu, Taipei (TW)

(73) Assignee: Macronix International Co., Ltd., Hsin-chu (TW)

( * ) Notice: Subject to any disclaimer, the term of this patent is extended or adjusted under 35 U.S.C. 154(b) by 667 days.

(21) Appl. No.: 12/685,440

(22) Filed: Jan. 11, 2010

(65) Prior Publication Data

US 2011/0170082 A1    Jul. 14, 2011

(51) Int. Cl.
*G03B 27/54* (2006.01)

(52) U.S. Cl.
USPC ............................................. 355/67

(58) Field of Classification Search
USPC .................................. 355/53, 67, 77, 52
See application file for complete search history.

(56) References Cited

U.S. PATENT DOCUMENTS

| | | | | |
|---|---|---|---|---|
| 7,030,966 B2 * | 4/2006 | Hansen | ............. | 355/67 |
| 7,180,576 B2 * | 2/2007 | Hansen | ............. | 355/67 |
| 8,081,294 B2 * | 12/2011 | Mimotogi | ............. | 355/68 |
| 2004/0137343 A1 * | 7/2004 | Eurlings et al. | ............. | 430/30 |
| 2005/0257187 A1 * | 11/2005 | Gallatin et al. | ............. | 716/21 |
| 2006/0107249 A1 * | 5/2006 | Zhang et al. | ............. | 716/21 |
| 2008/0158529 A1 * | 7/2008 | Hansen | ............. | 355/53 |
| 2009/0217218 A1 * | 8/2009 | Adam | ............. | 716/2 |

\* cited by examiner

*Primary Examiner* — Peter B Kim
*Assistant Examiner* — Deoram Persaud
(74) *Attorney, Agent, or Firm* — Alston & Bird LLP

(57) ABSTRACT

A method of optical proximity correction for a photolithographic progress in manufacturing semiconductor devices is disclosed. The method includes providing an illumination source in an optical system, dividing the illumination source into a number of segments in the form of concentric rings, and assigning a first intensity level to a first ring of a first radius and assigning a second intensity level to a second ring of a second radius, wherein the first intensity level is smaller than or equal to the second intensity level when the first radius is smaller than or equal to the second radius.

18 Claims, 7 Drawing Sheets

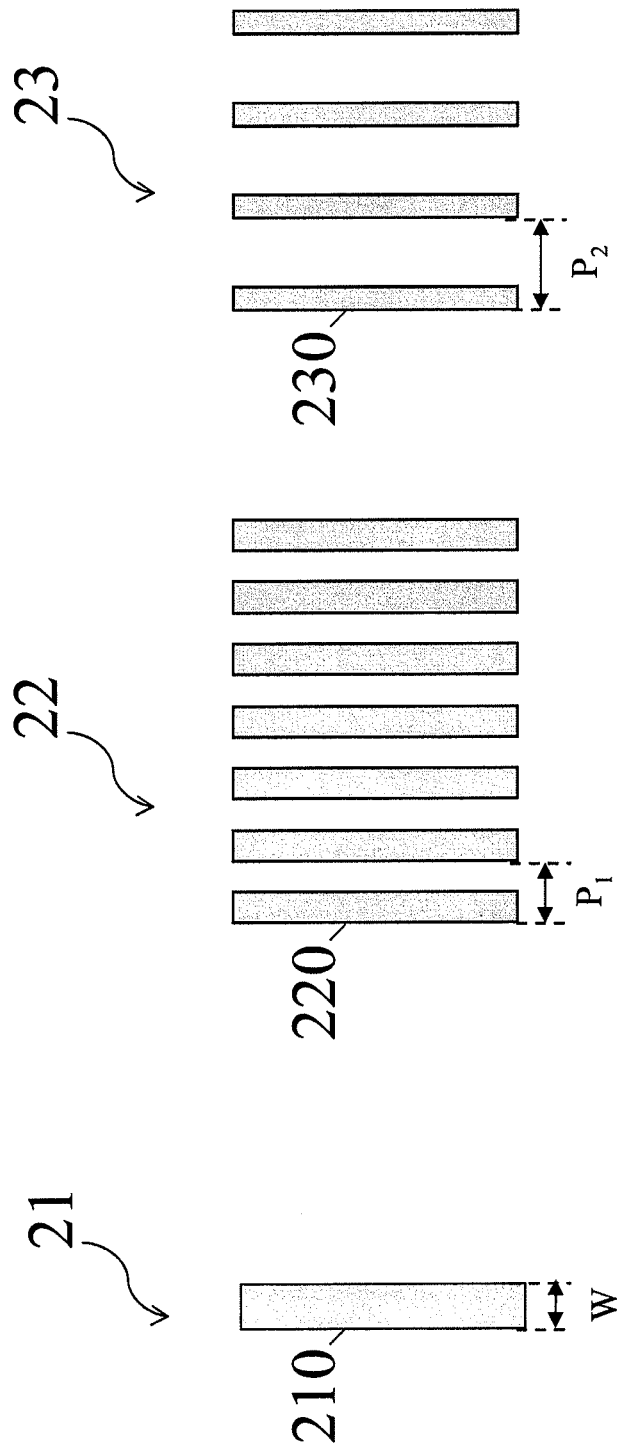

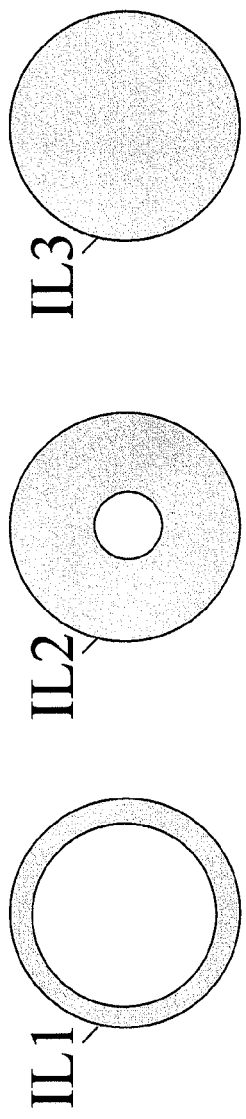
FIG. 5A
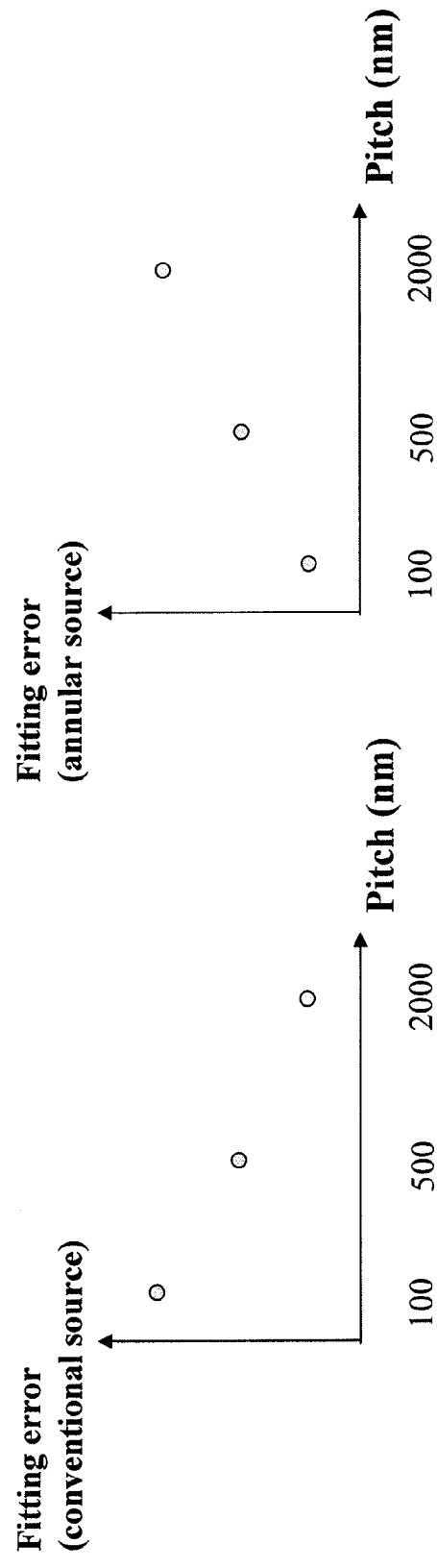
FIG. 5B
FIG. 5C

METHODS OF OPTICAL PROXIMITY CORRECTION IN MANUFACTURING SEMICONDUCTOR DEVICES

BACKGROUND OF THE INVENTION

The present invention relates generally to a method of optical proximity correction in manufacturing a semiconductor device and, more particularly, to a method of correcting a mask pattern for a photolithography progress in manufacturing a semiconductor device.

Optical proximity correction (OPC) is a photolithography enhancement technique commonly used to compensate for image errors due to diffraction or process effects. To improve the resolution of the lithography process, certain types of illumination, for example, conventional illumination, annular illumination, QUASAR illumination, etc., may be introduced to improve the quality of lithography. The illumination condition is also important for OPC modeling. FIGS. 1A and 1B are schematic diagrams illustrating a method of using different illuminations to build an OPC model in prior art. Referring to FIG. 1A, annular illumination IL1' may have an intensity of, for example, 1 and a radius of sigma-out/sigma-in of, for example, 0.9/0.7. Referring to FIG. 1B, the inner radius of annular illumination IL2' may be reduced to 0.2 without changing the intensity so as to improve the accuracy of the OPC model for some kinds of patterns. However, the method may result in a trade-off between different patterns. For example, an OPC model thus built may be suitable for an "isolated" pattern without compromising a "dense" pattern, or vice versa. Therefore, it may be desirable to have a method of OPC to alleviate the trade-off issue.

BRIEF SUMMARY OF THE INVENTION

Examples of the present invention may provide a method of optical proximity correction for a photolithographic progress in manufacturing semiconductor devices. The method includes collecting data in an optical system, the data including the critical dimension of a test pattern projected on a wafer and a set of exposure parameters associated with the test pattern in the setting of the optical system, dividing the size of an illumination source into a number of segments, modulating the intensity of each of the segments, calculating an intensity value based on the size and modulated intensity of each of the segments, calculating an evaluation value based on the intensity value and the set of exposure parameters, calculating a difference value based on the evaluation value and the critical dimension, repeating the steps of dividing and modulating to obtain a predetermined number of difference values, identifying one of the difference values that has the minimum value, and generating an adjusted patter based on the size and modulated intensity of each of the segments associated with the one difference value that has the minimum value.

Some examples of the present invention may also provide a method of optical proximity correction for a photolithographic progress in manufacturing semiconductor devices. The method includes providing an illumination source in an optical system, dividing the illumination source into a number of segments in the form of concentric rings, and assigning a first intensity level to a first ring of a first radius and assigning a second intensity level to a second ring of a second radius, wherein the first intensity level is smaller than or equal to the second intensity level when the first radius is smaller than or equal to the second radius.

Examples of the present invention may provide a system for optical proximity correction for a photolithographic progress in manufacturing semiconductor devices. The system includes a dividing module to divide an illumination source into a number of segments in the form of concentric rings, and a modulation module to assign a first intensity level to a first ring of a first radius and a second intensity level to a second ring of a second radius, wherein the first intensity level is smaller than or equal to the second intensity level when the first radius is smaller than or equal to the second radius.

Additional features and advantages of the present invention will be set forth in portion in the description which follows, and in portion will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, examples are shown in the drawings. It should be understood, however, that the invention is not limited to the precise arrangements and instrumentalities shown in the examples.

In the drawings:

FIGS. 2A, 2B and 2C are schematic diagrams illustrating different patterns to be formed on a mask in building an OPC model in accordance with an example of the present invention;

FIG. 5A is a schematic diagram illustrating different illumination sources for an optical system;

FIGS. 5B and 5C are schematic diagrams illustrating fitting errors in an OPC model with different illumination sources as shown in FIG. 5A;

DETAILED DESCRIPTION OF THE INVENTION

Figures 1A, 1B:
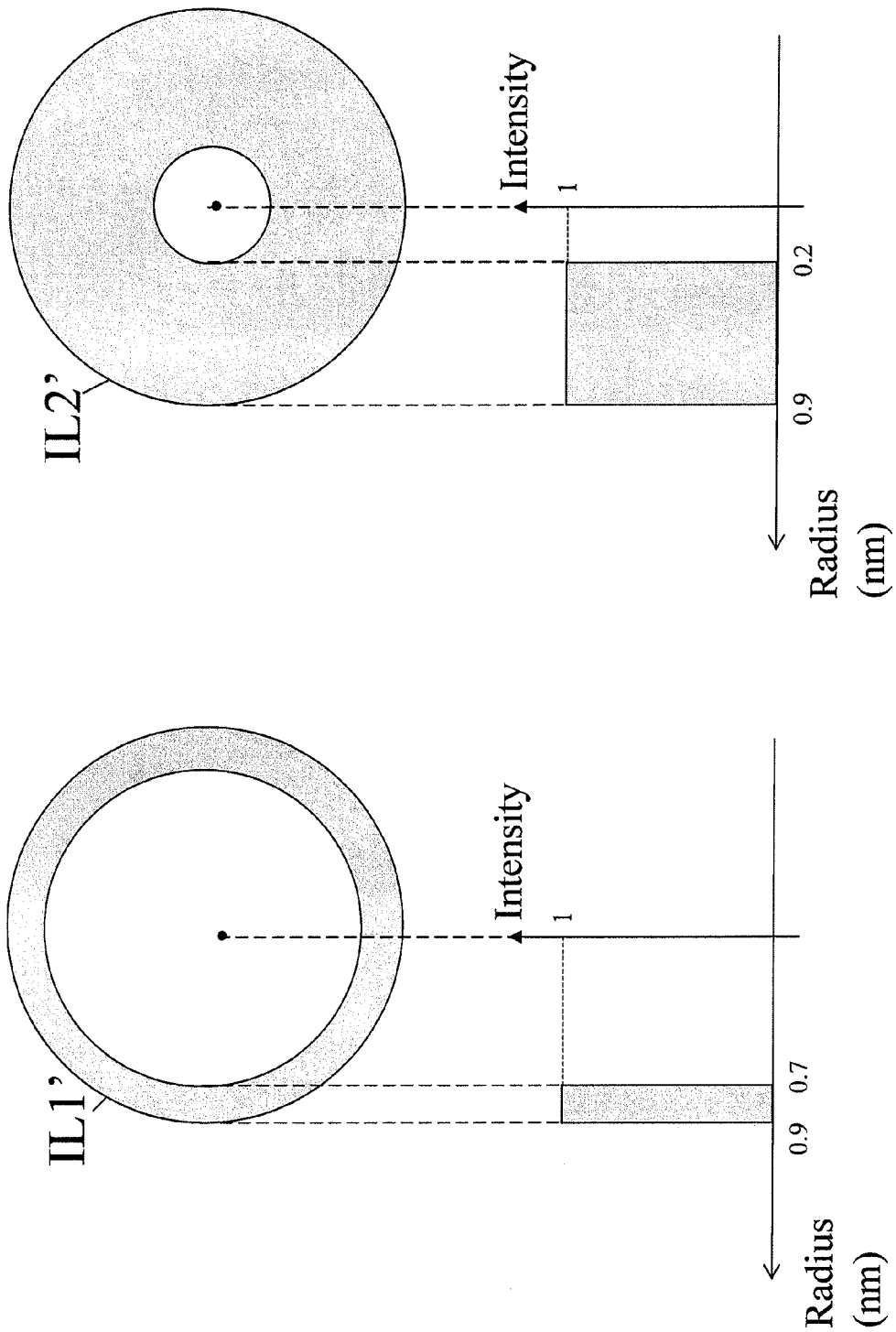
FIGS. 1A and 1B are schematic diagrams illustrating a method of using different illuminations to build an OPC model in prior art.

Reference will now be made in detail to the present examples of the invention, which are illustrated in the accompanying drawings. Wherever possible, the same reference numbers will be used throughout the drawings to refer to the same or like portions.

FIGS. 2A, 2B and 2C are schematic diagrams illustrating different patterns to be formed on a mask in building an OPC model in accordance with an example of the present invention. Referring to FIG. 2A, a pattern 21 may include an isolated bar 210 having a width "W" that meets the critical dimension (CD) in a photolithography system. Referring to FIGS. 2B and 2C, each of patterns 22 and 23 may include a number of bars 220 and 230 arranged in parallel. Each bar 220 and 230 may have a same width as bar 210. The pattern 22 may be similar to the pattern 23 except that, for example, the pitch "$P_1$," i.e., the distance between the edges of two immediately adjacent bars 220, is smaller than the pitch "$P_2$," the distance between the edges of two immediately adjacent bars 230. The patterns 21, 22 and 23 may be called an "isolated" pattern, a "dense" pattern and a "semi-iso" or "semi-dense" pattern, respectively.

Figure 3A:
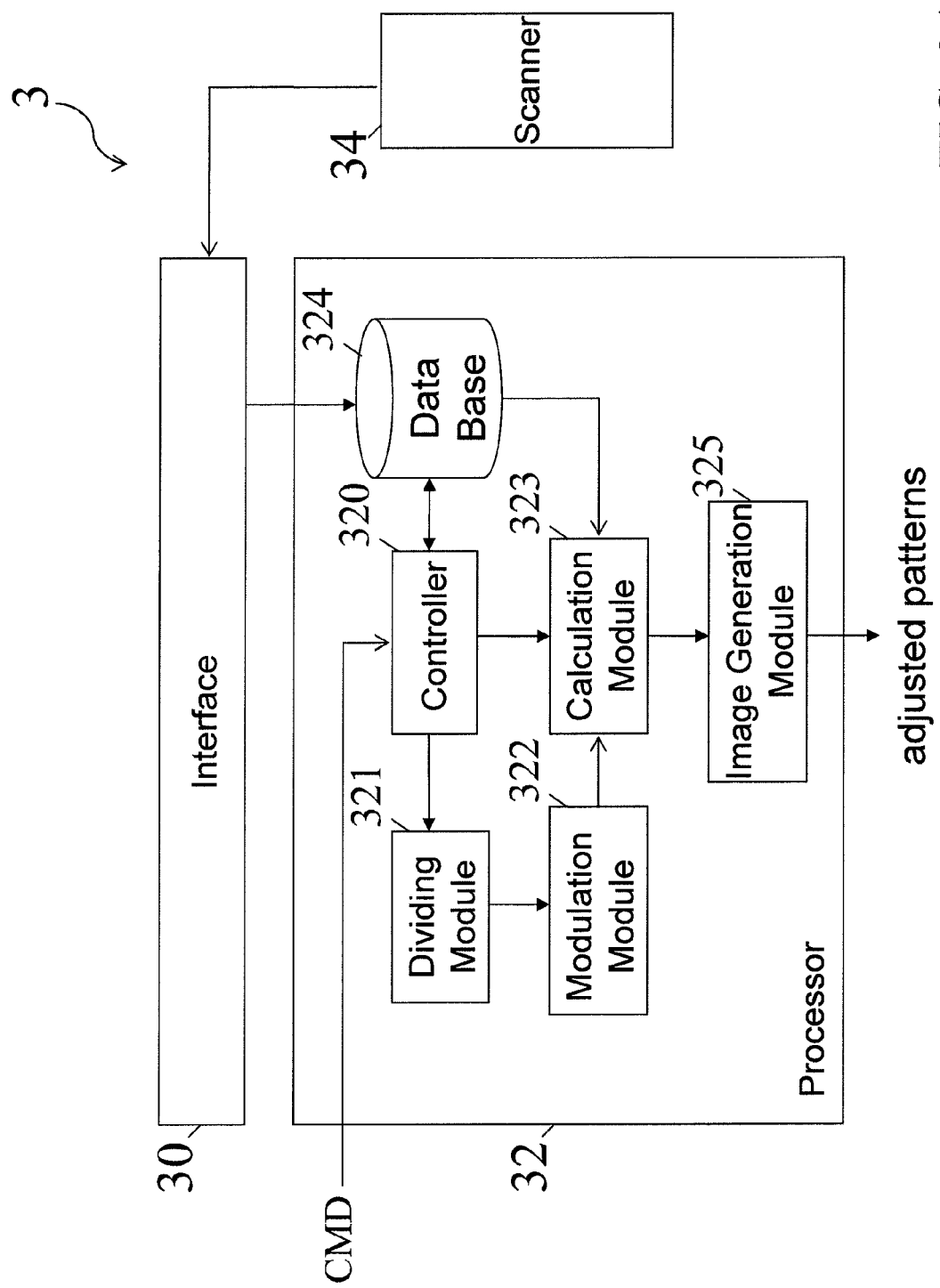
FIG. 3A is a schematic diagram illustrating an optical system to create an OPC model in accordance with an example of the present invention.

FIG. 3A is a schematic diagram illustrating an optical system 3 to create an OPC model in accordance with an example of the present invention. Referring to FIG. 3A, the optical system 3 may include an interface 30, a processor 32 and a scanner 34. The interface 30 may include a communication port to support protocols for the communications between the processor 32 and the scanner 34. The processor 32 may further include a controller 320, a dividing module 321, a modulation module 322, a calculation module 323, a data base 324 and an image generation module 325.

Figure 3B:
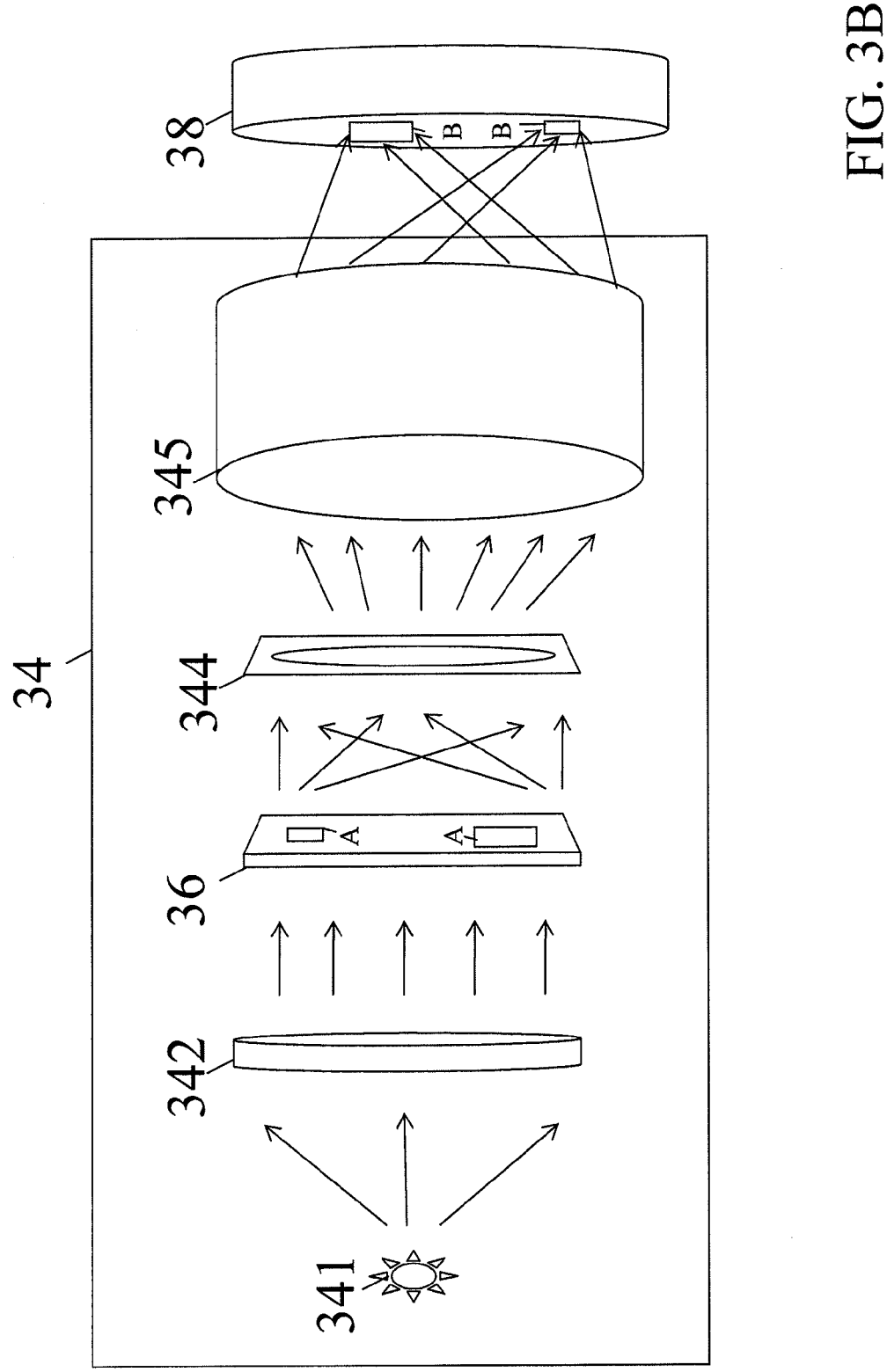
FIG. 3B is a schematic diagram illustrating an example of a scanner shown in FIG. 3A.

FIG. 3B is a schematic diagram illustrating an example of the scanner 34 shown in FIG. 3A. Referring to FIG. 3B, the scanner 34 may further include an illumination source 341, a condenser 342, an aperture 344 and a lens 345. A radiation beam from the illumination source 341 may be collimated by the condenser 342, then pass through a mask 36, the aperture 344 and lens 345 toward a wafer 38, and forms images on the wafer 38. In order to form the patterns of interest on wafer 38, an OPC model may be introduced to adjust the patterns on the mask 36, which will be described in paragraphs below. The mask 36 may include a test pattern "A," which may further include a combination of isolated, dense and semi-dense patterns such as the patterns 21, 22 and 23 described and illustrated with reference to FIGS. 2A, 2B and 2C. After the radiation beam is projected, a pattern "B" may be formed on the wafer 38, which may include a combination of patterns different from those on the mask A due to optical factors. As a result, the mask A may be modified in layout so as to compensate for the optical factors in an OPC process.

In a set-up stage of the optical system 3, exposure information such as parameters associated with the optical system 3 may be collected by using, for example, masks with different pattern combinations and illumination sources of various types. Examples of the exposure information or parameters may include but are not limited to the critical dimensions (CDs) of the patterns A and B, the wavelength, frequency and type of the illumination source, the numeric values of the aperture, and the materials and optical characteristics of photo resists.

Referring also to FIG. 3A, exposure information collected at the scanner 34 may be sent to the processor 32 and stored in the data base 324, wherein the critical dimension of the pattern B may serve as empirical data to facilitate the building of a desirable OPC model. In an OPC stage subsequent to the set-up stage, a command (CMD) from, for example, a user of the optical system 3, may be sent to the controller 320 to start an OPC modeling process in the processor 32. The OPC modeling process may include a predetermined number of calculations in order to determine a desirable OPC model. In one example, the command may include information on the number of segments for each time of calculation. In another example, the command may include information on an intensity rule for each time of calculation. Based on the command, the dividing module 321 may divide the radius of the illumination source into a number of segments. For example, a radius of 0.45/0.9 (nm) may be divided to four segments, i.e., 0.45/0.55, 0.55/0.7, 0.7/0.8 and 0.8/0.9. The number of segments, four in the present example, is only exemplary for the purpose of convenience. In implementation, several tens of or hundreds of segments may be made to achieve a desirable OPC model.

The modulation module 322 may modulate the intensity of each of the segments in frequency domain. For example, the modulation module 322 may modulate the magnitude of electric field of each segment. Unlike the method illustrated in FIGS. 1A and 1B, where a uniform intensity is used, the modulation module 322 may assign a magnitude or intensity to each of the segments. In one example, an intensity $I_x$ may be assigned to an x-th one of the segments in accordance with a rule as given in equation (1) below.

$$I_x = ax + 1 \quad (1)$$

where $a = -1/(n+1)$, n being the number of segments and x being an integer from 0 to n−1.

The calculation module 323 may add up the magnitude or intensity of each modulated segment by, for example, equation (2) below, resulting in a first intensity $S_{T1}$ for a modulated illumination source.

$$S_{T1} = S_0 * I_0 + S_1 * I_1 + S_2 * I_2 + S_3 * I_3 + \ldots + S_{n-1} * I_{n-1} \quad (2)$$

where $S_0, S_1, S_2 \ldots S_{n-1}$ are the radiuses of the segments and $I_0, I_1, I_2 \ldots I_{n-1}$ are the modulated intensities of the segments.

The first intensity $S_{T1}$ and a set of exposure information stored in the data base 324 may then be used by the calculation module 323 to generate a first evaluation value $CD_1$ representing a critical dimension that may be formed on the wafer 38. The set of exposure information may include information on, for example, the photoresist, aperture and the critical dimension of the pattern B (denoted as $CD_B$) associated with the current mask 36. Furthermore, the calculation module 323 may compare the critical dimension $CD_B$ with the first evaluation value $CD_1$, resulting in a first difference value $D_1$.

Next, in one example, the number of segments may be changed, which may be specified in the command. Accordingly, a second intensity $S_{T2}$ may be obtained. The second intensity $S_{T2}$ and the set of exposure information stored in the data base 324 may then be used by the calculation module 323 to generate a second evaluation value $CD_2$. Furthermore, the calculation module 323 may compare the critical dimension $CD_B$ with the second evaluation value $CD_2$, resulting in a second difference value $D_2$.

After the predetermined number of calculations, for example, "i" times of calculations, the difference values $D_1$ to $D_i$ may be obtained and then may be compared with one another by the calculation module 323 to determine the minimum difference $D_{min}$. In one example, a j-th difference $D_j$ may be obtained in equation (3) below.

$$D_j = \Sigma(CD_B - CD_j) * W_j \quad (3)$$

where "j" is a positive integer between 1 and "i," and W is a given weight relevant to the illumination source 341. When the minimum difference $D_{min}$ is determined, the image generation module 325 may generate an image with adjusted patterns in accordance with the information on the modulated illumination source, i.e., the radius and intensity of each segment that achieves the minimum difference $D_{min}$, and the collected exposure information stored in the data base 324.

Figure 4:
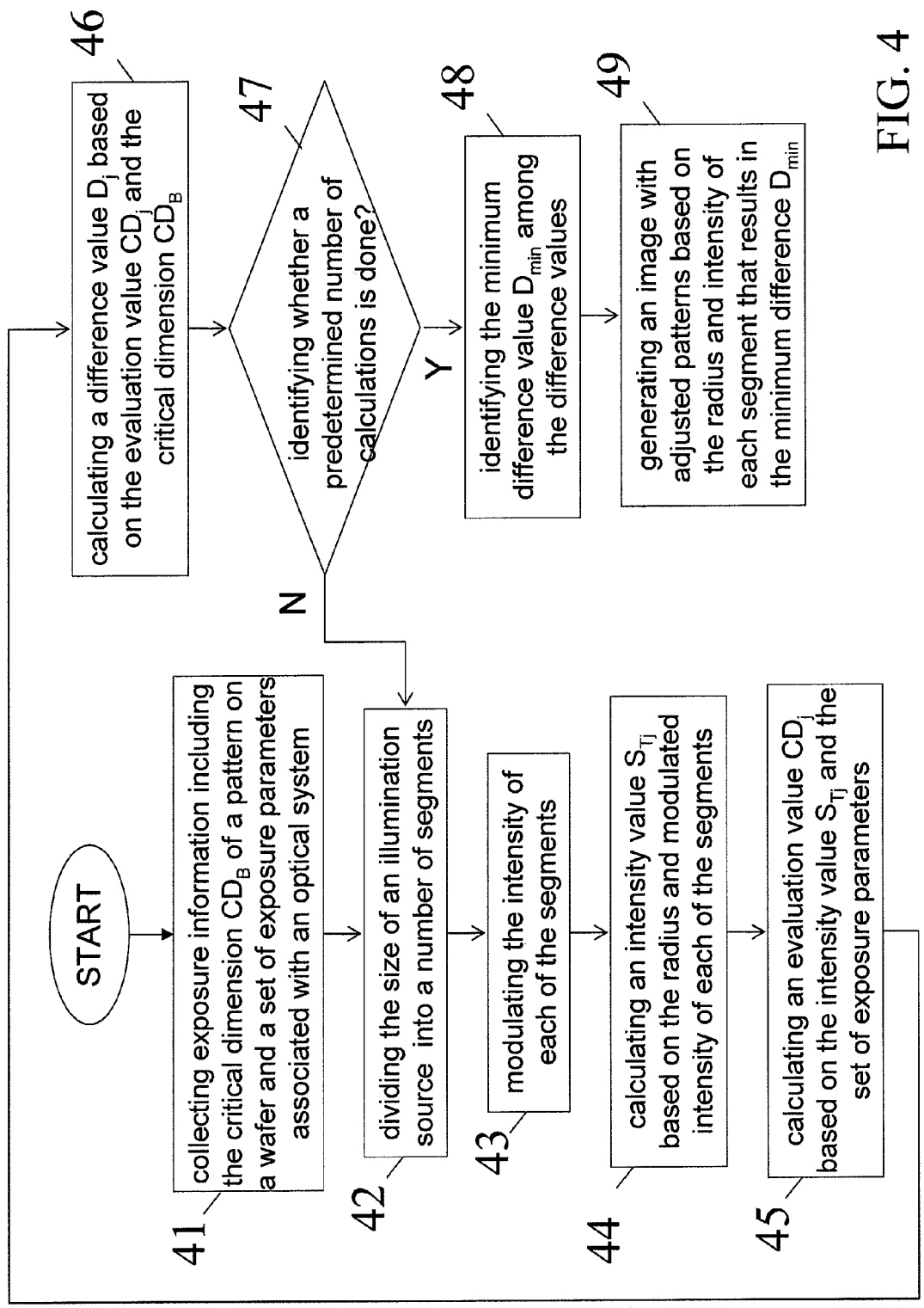
FIG. 4 is a flow diagram illustrating a method of generating a mask pattern for fabricating a semiconductor device in accordance with an example of the present invention.

FIG. 4 is a flow diagram illustrating a method of generating a mask pattern for fabricating a semiconductor device in accordance with an example of the present invention. Referring to FIG. 4, at step 41, exposure information such as parameters or optical characteristics in an optical system may be collected. The exposure information may include empirical data $CD_B$, the critical dimension of a test pattern projected on a wafer, and a set of exposure parameters associated with the optical setting for the test pattern in an optical system, including, for example, the numeric values of an aperture and the optical characteristics of photoresist used in the optical system. The exposure information may be stored in a memory or data base.

Next, at step 42, the radius of an illumination source may be divided into a number of segments. The segments may take the form of concentric rings. The number of segments may be different at each calculation in one example, and may be kept the same for each calculation in another example.

The intensity of each of the segments may then be modulated in frequency domain at step 43. In one example, the intensity of a segment may be decreased progressively as the segment draws near the center of an illumination source. For example, a first intensity level may be assign to a first ring of a first radius while a second intensity level may be assigned to a second ring of a second radius, and the first intensity level is smaller than or equal to the second intensity level when the first radius is smaller than or equal to the second radius. Furthermore, the rule for assigning intensity to each of a number of segments may be different at each calculation.

At step 44, an intensity value $S_{Ti}$ based on the radius and modulated intensity of each of the segments may be calculated, "i" being a predetermined number of calculations. In one example, the intensity value $S_{Ti}$ may be the sum of products of the radius of each segment times the modulated intensity of the each segment.

At step 45, an evaluation value $CD_j$ based on the intensity value $S_{Ti}$ and the set of exposure parameters may be calculated, "j" being an integer between 1 and i. The evaluation value $CD_j$ may represent the critical dimension of patterns to be formed on the wafer.

Next, at step 46, a difference value $D_j$ based on the evaluation value $CD_j$ and the critical dimension $CD_B$ may be calculated. In one example, the difference value $D_j$ is a function of the evaluation value $CD_j$ minus the critical dimension value $CD_B$.

It may then be identified at step 47 whether the predetermined number of calculations is done, that is, whether the number "i" is reached. If not, steps 42 to 46 may be repeated. In repeating the steps 42 and 43, in one example, the number of segments in the radius of the illumination source at step 42 may be changed by, for example, providing a command signal to the optical system. In another example, the rule for assigning intensity to each of the segments at step 43 may be changed.

If the predetermined number of calculations is achieved, at step 48, one of the difference values $D_1$ to $D_i$ with the minimum difference $D_{min}$ may be identified. Data for adjustment including the radius and modulated of each segment as well as the exposure information associated with the one difference value with the minimum difference $D_{min}$ may be retrieved from the memory or data base.

At step 49, an image with adjusted patterns based on the data for adjustment may be generated, which may be used in a photolithographic process in semiconductor device manufacturing.

FIG. 5A is a schematic diagram illustrating different illumination sources IL1 to IL3 for an optical system. Referring to FIG. 5A, the illumination source IL1, termed an "annular" source, may be suitable for use in a dense pattern such as the pattern 22 described and illustrated with reference to FIG. 2B. The illumination source IL3, termed a "conventional" source, may be suitable for use in an isolated pattern such as the pattern 21 described and illustrated with reference to FIG. 2A. The illumination source IL2, which may be called a "weak-annular" source, may be suitable for use in a semi-dense or semi-iso pattern such as the pattern 23 described and illustrated with reference to FIG. 2C.

FIGS. 5B and 5C are schematic diagrams illustrating fitting errors in an OPC model with different illumination sources as shown in FIG. 5A. Referring to FIG. 5B, given a conventional source, as the pitch becomes greater, the fitting error declines, which means that the illumination sources IL2 and IL3 may have good performance or less fitting errors in an isolated pattern.

Referring to FIG. 5C, given an annular source, as the pitch becomes smaller, the fitting error decreases, which means that the illumination source IL1 may have good performance or less fitting errors in a dense pattern.

Figures 6A, 6B:
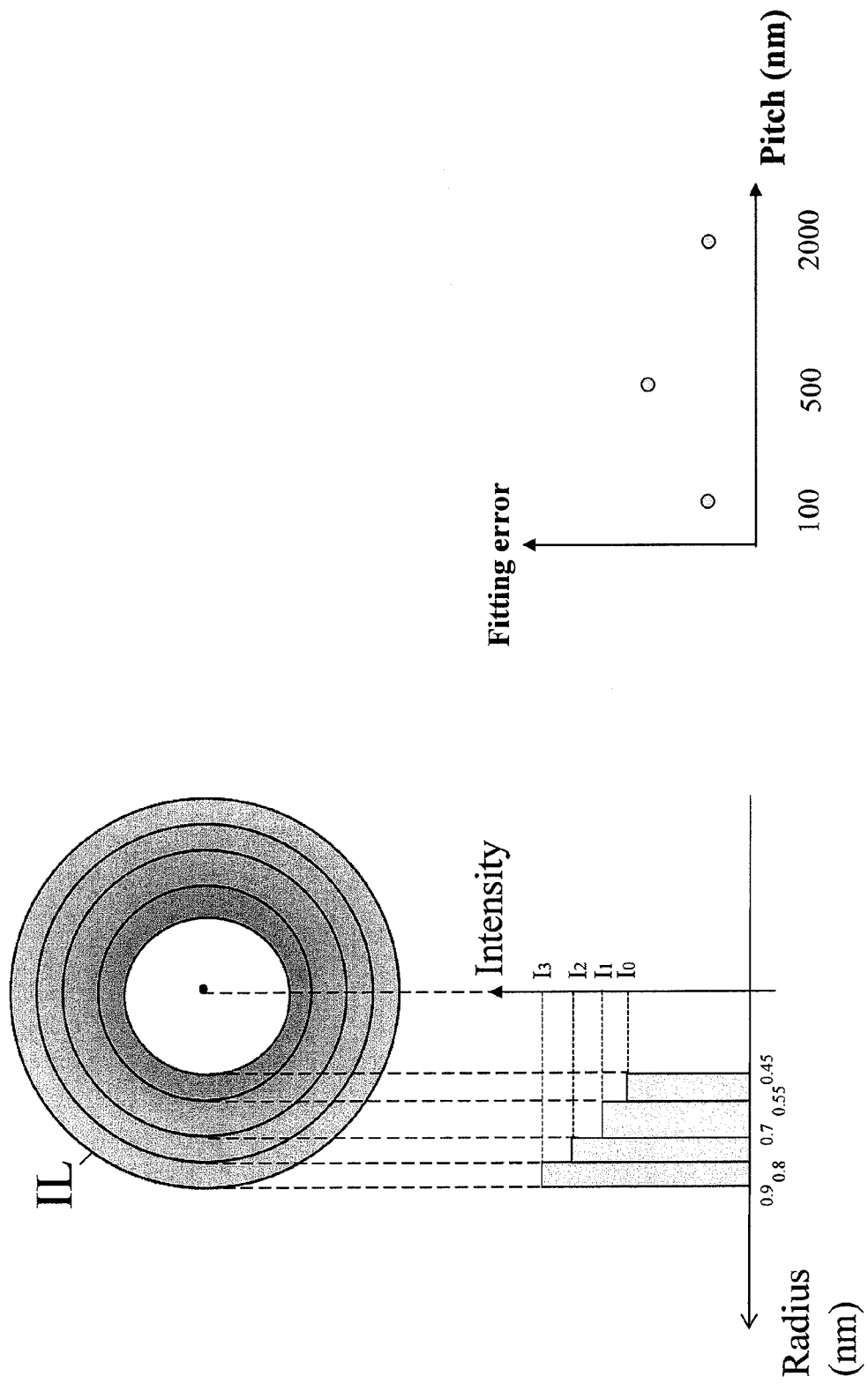
FIG. 6A is a schematic diagram illustrating an illumination source in accordance with an example of the present invention.
FIG. 6B is a schematic diagram illustrating fitting errors in an OPC model with illumination source IL as shown in FIG. 6A.

FIG. 6A is a schematic diagram illustrating an illumination source IL in accordance with an example of the present invention. Referring to FIG. 6A, the radius of the exemplary illumination source IL, 0.45/0.9 (nm), may be divided to, for example, four segments 0.45/0.55, 0.55/0.7, 0.7/0.8 and 0.8/0.9. Each of the segments may be respectively modulated to an intensity of interest, i.e., $I_0$, $I_1$, $I_2$, and $I_3$.

FIG. 6B is a schematic diagram illustrating fitting errors in an OPC model with the illumination source IL shown in FIG. 6A. Referring to FIG. 6B, when an annular source used in an isolated pattern is modified into one similar to the weak annular source IL, the fitting errors in the range of larger pitches may be reduced as compared to the fitting errors of an annular source illustrated in FIG. 5B. Alternatively, when a conventional source used in a dense pattern is modified into one similar to the weak annular source IL, the fitting errors in the range of smaller pitches may be reduced as compared to the fitting errors of a conventional source illustrated in FIG. 5A.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

Further, in describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A method of optical proximity correction for a photolithographic process in manufacturing semiconductor devices, the method comprising:

collecting data in an optical system, the data including a critical dimension of a test pattern projected on a wafer and a set of exposure parameters associated with the test pattern in a setting of the optical system;

dividing the size of an illumination source into a number of segments;

modulating an intensity of each of the segments;

calculating an intensity value based on the size and modulated intensity of each of the segments;

calculating an evaluation value based on the intensity value and the set of exposure parameters;

calculating a difference value based on the evaluation value and the critical dimension;

repeating the steps of dividing and modulating to obtain a predetermined number of difference values;

identifying one of the difference values that has a minimum value; and generating an adjusted pattern based on the size and modulated intensity of each of the segments associated with the one difference value that has the minimum value, wherein modulating the intensity of each of the segments further includes assigning an intensity level $I_x$ to an x-th one of a number of "n" segments in accordance with a rule: $I_x = ax + 1$, where $a = -1/(n+1)$, x being an integer from 0 to n−1.

2. The method of claim 1, wherein modulating the intensity of each of the segments further includes assigning the intensity level to each of the segments in a decreasing manner as the segment draws near the center of the illumination source.

3. The method of claim 1, wherein dividing the size of an illumination source includes dividing the radius of the illumination source into a number of segments in the form of concentric rings, and wherein modulating the intensity of each of the segments includes assigning a first intensity level to an inner ring and a second intensity level to an outer ring, the first intensity level being smaller than the second intensity level.

4. The method of claim 1, wherein repeating the step of dividing includes dividing the size of an illumination source into another number of segments.

5. The method of claim 1, wherein modulating the intensity of each of the segments includes assigning the intensity level to each of the segments in accordance with a first rule, and wherein repeating the step modulating includes assigning the intensity level to each of the segments in accordance with a second rule.

6. The method of claim 1, wherein calculating the intensity value includes calculating the sum of products of the size of each segment multiplies by the modulated intensity of each segment.

7. The method of claim 1, wherein the difference value is a function of the critical dimension minus the evaluation value.

8. A method of optical proximity correction for a photolithographic process in manufacturing semiconductor devices, the method comprising:

providing an illumination source in an optical system;

dividing the illumination source into a number of segments in the form of concentric rings;

assigning a first intensity level to a first ring of a first radius and assigning a second intensity level to a second ring of a second radius, wherein the first intensity level is smaller than or equal to the second intensity level when the first radius is smaller than or equal to the second radius; and assigning an intensity level $I_x$ to an x-th one of a number of "n" segments in accordance with a rule: $I_x = ax + 1$ where $a = -1/(n+1)$, x being an integer from 0 to n−1.

9. The method of claim 8 further comprising collecting data in the optical system, the data including a critical dimension of a test pattern projected on a wafer and a set of exposure parameters associated with the test pattern in a setting of the optical system.

10. The method of claim 9 further comprising:

calculating an intensity value based on the radius and assigned intensity level of each of the segments;

calculating an evaluation value based on the intensity value and the set of exposure parameters;

calculating a difference value based on the evaluation value and the critical dimension.

11. The method of claim 10 further comprising:

repeating the steps of dividing and assigning to obtain a predetermined number of difference values;

identifying one of the difference values that has a minimum value; and generating an adjusted pattern based on the size and modulated intensity of each of the segments associated with the one difference value that has the minimum value.

12. The method of claim 11, wherein repeating the step of dividing includes dividing the size of an illumination source into another number of segments.

13. The method of claim 11, wherein assigning the first and the second intensity levels includes assigning the intensity level to each of the segments in accordance with a first rule, and wherein repeating the step of assigning includes assigning the intensity level to each of the segments in accordance with a second rule.

14. A system for optical proximity correction for a photolithographic process in manufacturing semiconductor devices, the system comprising:

a dividing module to divide an illumination source into a number of segments in the form of concentric rings; and a modulation module to assign a first intensity level to a first ring of a first radius and a second intensity level to a second ring of a second radius, wherein the first intensity level is smaller than or equal to the second intensity level when the first radius is smaller than or equal to the second radius, wherein the modulation module further includes assigning an intensity level $I_x$ to an x-th one of a number of "n" seggments in accordance with a rule: $I_x = ax + 1$, where $a = -1/(n+1)$, x being an integer from 0 to n−1.

15. The system of claim 14 further comprising a memory device to store data related to an optical system, the data including a critical dimension of a test pattern projected on a wafer and a set of exposure parameters associated with the test pattern in a setting of the optical system.

16. The system of claim 15 further comprising a calculation module to calculate an intensity value based on the radius and assigned intensity level of each of the segments, calculate an evaluation value based on the intensity value and the set of exposure parameters, and calculate a difference value based on the evaluation value and the critical dimension.

17. The method of claim 16, wherein the calculation module identifies one of difference values that has a minimum value.

18. The method of claim 17 further comprising a generation module to generate an adjusted pattern based on the size and assigned intensity of each of the segments associated with the one difference value that has the minimum value.

* * * * *

UNITED STATES PATENT AND TRADEMARK OFFICE
CERTIFICATE OF CORRECTION

PATENT NO.       : 8,446,565 B2  
APPLICATION NO.  : 12/685440  
DATED            : May 21, 2013  
INVENTOR(S)      : Hsuan et al.

It is certified that error appears in the above-identified patent and that said Letters Patent is hereby corrected as shown below:

In the Claims:

Column 8  
Line 45, "seggments" should read --segments--

Signed and Sealed this  
Sixth Day of August, 2013

Teresa Stanek Rea  
*Acting Director of the United States Patent and Trademark Office*